(12) United States Patent
Wu

(10) Patent No.: US 8,887,385 B2
(45) Date of Patent: Nov. 18, 2014

(54) IMPEDANCE MATCHING METHOD

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 27 days.

(21) Appl. No.: 13/534,217

(22) Filed: Jun. 27, 2012

(65) Prior Publication Data

US 2013/0269983 A1 Oct. 17, 2013

(30) Foreign Application Priority Data

Apr. 16, 2012 (TW) .............................. 101113392 A

(51) Int. Cl.
*H05K 3/02* (2006.01)

(52) U.S. Cl.
USPC .................................. 29/846; 29/825; 29/832

(58) Field of Classification Search
CPC ......... H01L 24/80; H01L 24/81; H01L 24/82; H01L 24/83; H01L 23/66
USPC ..................................... 29/825, 832, 833, 840
See application file for complete search history.

(56) References Cited

U.S. PATENT DOCUMENTS

| 5,696,466 | A | * | 12/1997 | Li ................................. | 330/286 |
| 7,001,834 | B2 | * | 2/2006 | Devnani et al. ............... | 438/599 |
| 7,064,278 | B2 | * | 6/2006 | Seckora ......................... | 174/260 |
| 7,233,061 | B1 | * | 6/2007 | Conn ............................. | 257/686 |
| 2003/0177637 | A1 | * | 9/2003 | Seckora ......................... | 29/832 |
| 2003/0183919 | A1 | * | 10/2003 | Devnani et al. ............... | 257/691 |

* cited by examiner

*Primary Examiner* — Carl Arbes
(74) *Attorney, Agent, or Firm* — Novak Druce Connolly Bove + Quigg LLP

(57) ABSTRACT

A circuit board assembly includes a circuit board, at least one pad formed on the circuit board, and at least one connection line. Each of the at least one connection line includes a connection end connected to a respective one of the at least one pad and has the same resistance value as the respective pad.

2 Claims, 6 Drawing Sheets

# IMPEDANCE MATCHING METHOD

BACKGROUND

1. Technical Field

The present disclosure relates to a circuit board assembly and an impedance matching method for the circuit board assembly.

2. Description of Related Art

Wireless radio frequency transceiver technology as a new fiber-optic connector standard has been gradually applied to electronic products. Current radio frequency transceivers can reach the speed of the single-channel 10 Gb/s, in such a high-frequency transmission, impedance matching becomes particularly important. If there is an impedance mismatch, very large amounts of energy will be lost and the bit error rate increased, so the impedance matching design is very important in the wireless radio frequency transceiver. Existing technology is commonly used to change the circuit design of a high-frequency circuit to change the impedance, but in order to achieve the connected circuit impedance matching, this matching method is more complicated. In addition, in changing the circuit design, errors inevitably arise. This results in impedance matching which is not ideal.

Therefore, it is desirable to provide a circuit board assembly and an impedance matching method for the circuit board assembly, which can overcome the above-mentioned limitation.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
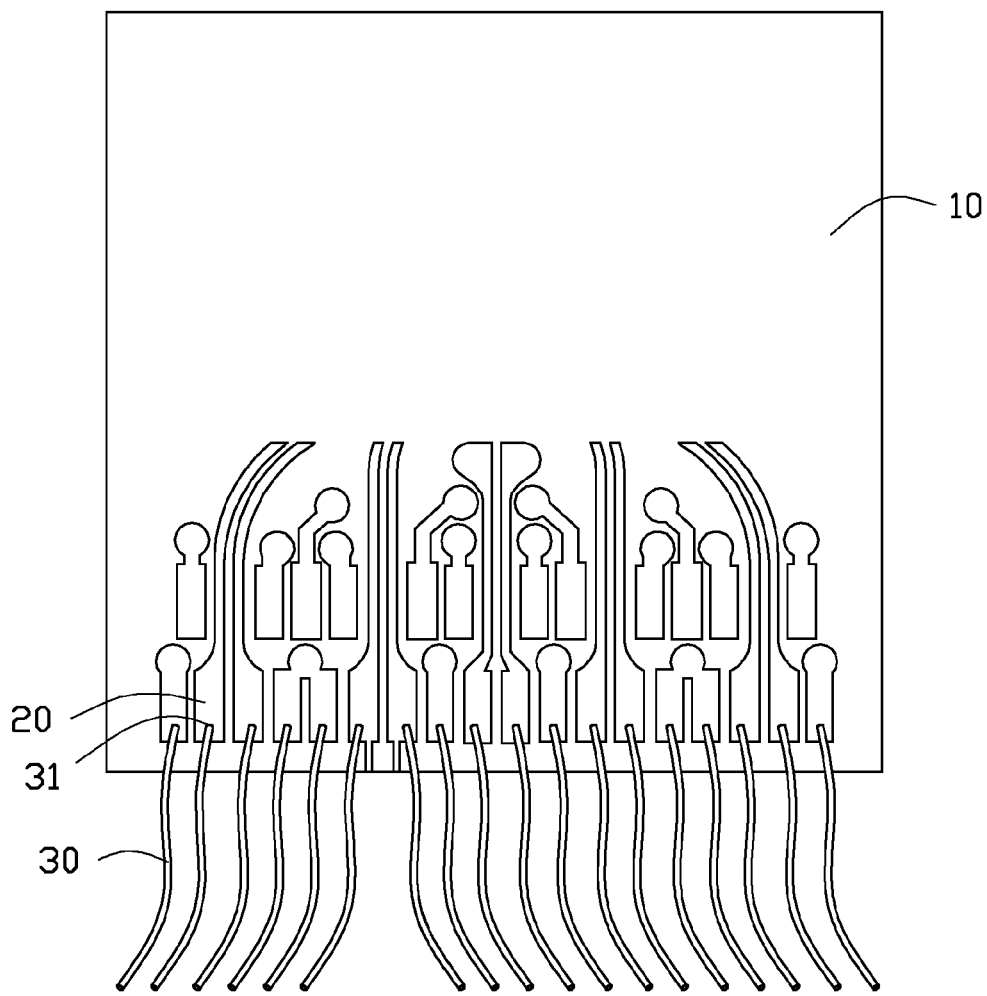
FIG. 1 is an assembled, isometric view of a circuit board assembly which includes a circuit board, a number of pads, and a number of connection lines, according to a first exemplary embodiment.
Figure 2:
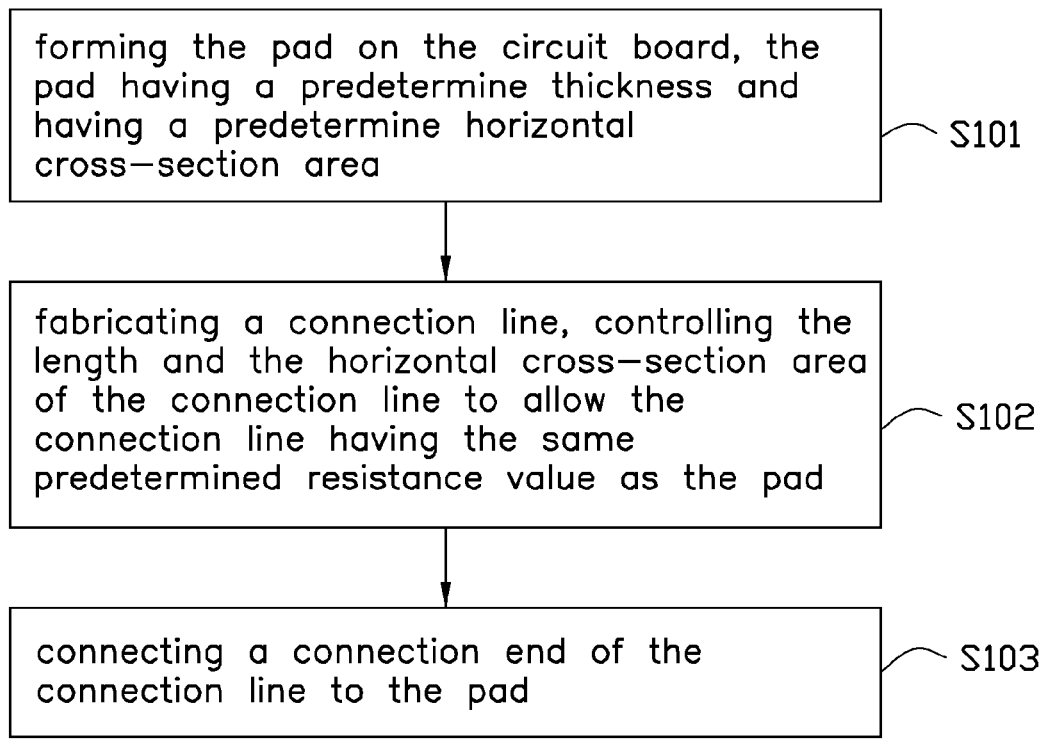
FIG. 2 is a flowchart of an impedance matching method, according to a second exemplary embodiment.

FIG. 1 illustrates a circuit board assembly 100 according to a first exemplary embodiment. The circuit board assembly 100 includes a circuit board 10, a number of pads 20, and a number of connection lines 30. In the embodiment, the circuit board assembly 100 is used in a wireless radio frequency transceiver (not shown).

The circuit board 10 is substantially rectangular. The number of pads 20 are formed on one sidewall of the circuit board 10. It should be noted that, the circuit board 10 also can be other shapes, such as circular.

Each of the connection lines 30 includes a connection end 31. Each of the connection ends 31 is connected to a pad 20. In particular, a pad 20 and a connection line 30 connected to the pad 20 have the same resistance value.

One of the pads 20 and one of the connection lines 30 connected to the pad 20 of the circuit board assembly 100 have the same resistance value, as such, the circuit design for reaching an impedance matching, is made easier, with a significant improvement in circuit characteristics.

Figure 3:
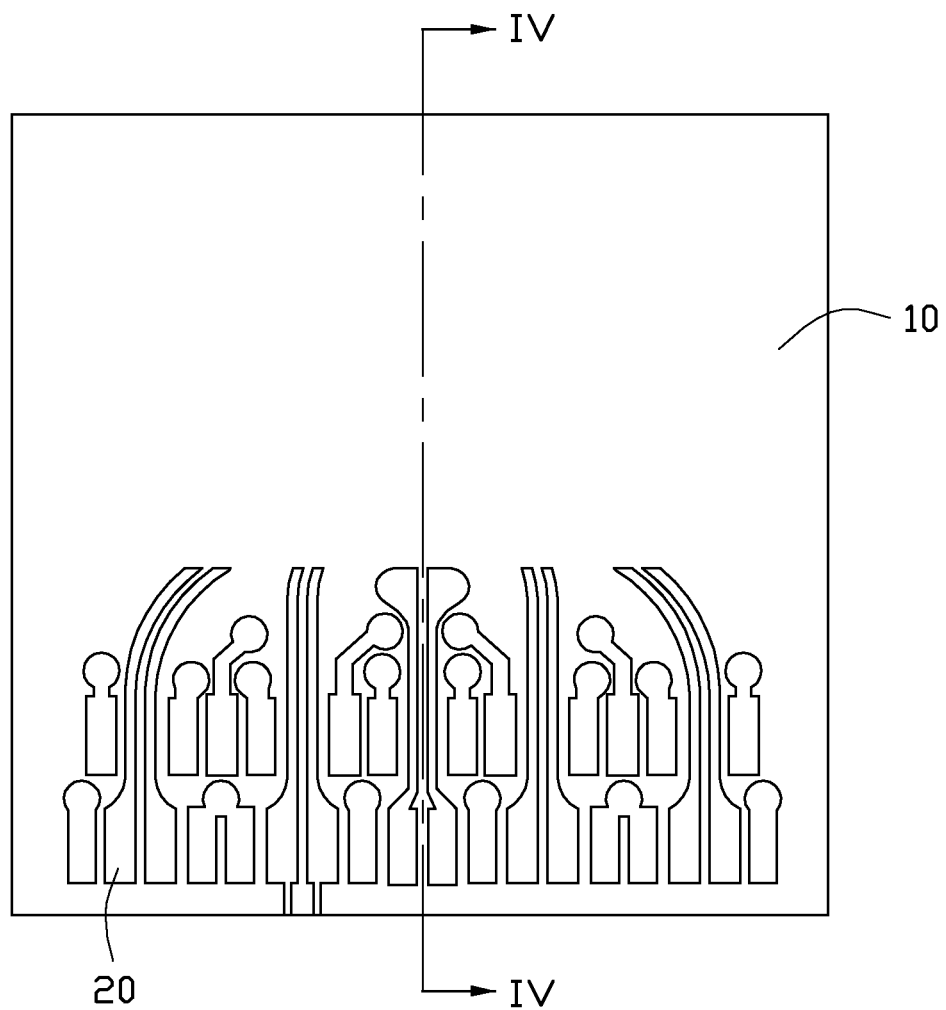
FIG. 3 is an assembled, isometric view of the circuit board and the number of pads of FIG. 1.
Figure 4:
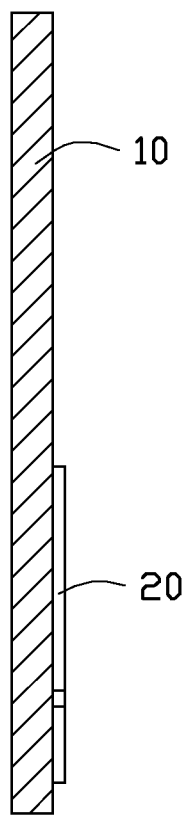
FIG. 4 is a schematic cross-section of the circuit board and one of the pads taken along line IV-IV.

FIG. 3 is a flowchart of a method for impedance matching between a pad 20 and a connection line 30, according to a second exemplary embodiment. Also referring to FIG. 4, the method includes the following steps: S101: forming the pad 20 on the circuit board 10, the pad 20 having a predetermined thickness and having a predetermined horizontal cross-sectional area. According to the formula: $R=\rho L/A$, wherein R is the resistance value (unit is the ohm) of the pad 20; $\rho$ is the resistivity of the pad 20 (unit is ohm·m); L is the thickness of the pad 20 (unit is m); A is the horizontal cross-sectional area of the pad 20 (unit is the square meter). As such, only by controlling the thickness and the horizontal cross-section area of the pad 20 does the pad 20 have a predetermined resistance value. In the embodiment, the resistance value of the pad 20 is 50 ohms.

S102: fabricating the connection line 30, controlling the length and the horizontal cross-sectional area of the connection line 30 to create a connection line 30 having the same predetermined resistance value as the pad 20. According to the formula: $R=\rho L/A$, wherein R is the resistance value of the connection line 30 (unit is the ohm); $\rho$ is the resistivity of the connection line 30 (unit is ohm·m); L is the length of the connection line 30 (unit is m); A is the horizontal cross-sectional area of the connection line 30 (unit is the square meter). As such, only by controlling the length and the horizontal cross-sectional area of the connection line 30 is the creation of a connection line 30 allowed having the same predetermined resistance value as the pad 20.

S103: electrically connecting the connection end 31 of the connection line 30 to the pad 20.

Figure 5:
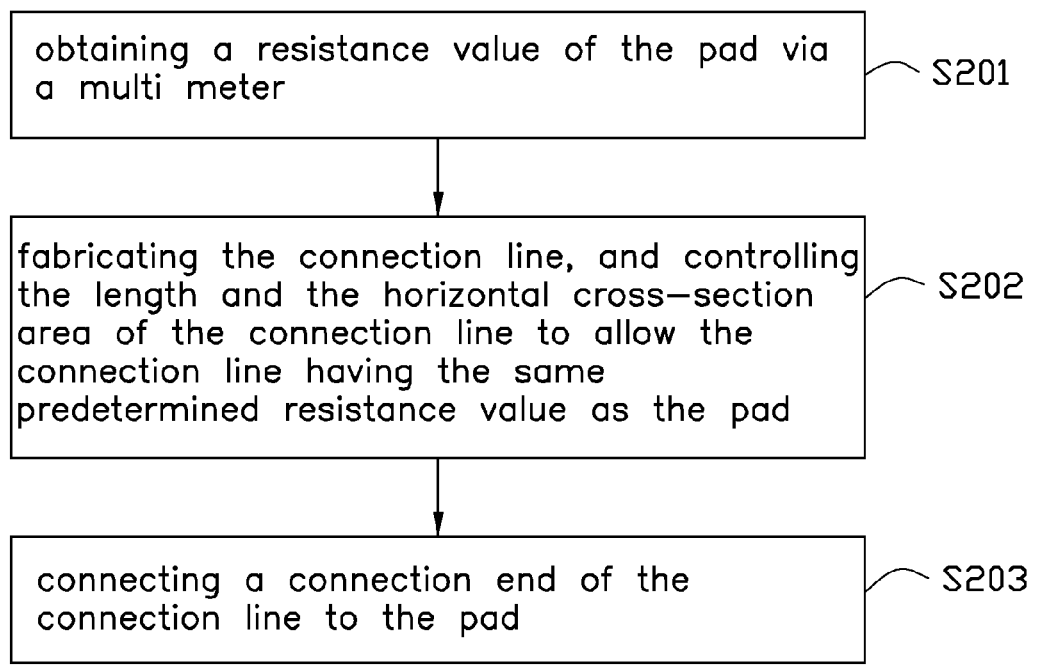
FIG. 5 is a flowchart of an impedance matching method, according to a third exemplary embodiment.

FIG. 5, is a flowchart of a method for impedance matching between a pad 20 and a connection line 30, according to a third exemplary embodiment. The method includes the following steps: S201: obtaining a resistance value of the pad 20 via a multimeter; S202: fabricating the connection line 30, and controlling the length and the horizontal cross-sectional area of the connection line 30 to create a connection line 30 having the same predetermined resistance value as the pad 20; S203: electrically connecting a connection end 31 of the connection line 30 to the pad 20.

Figure 6:
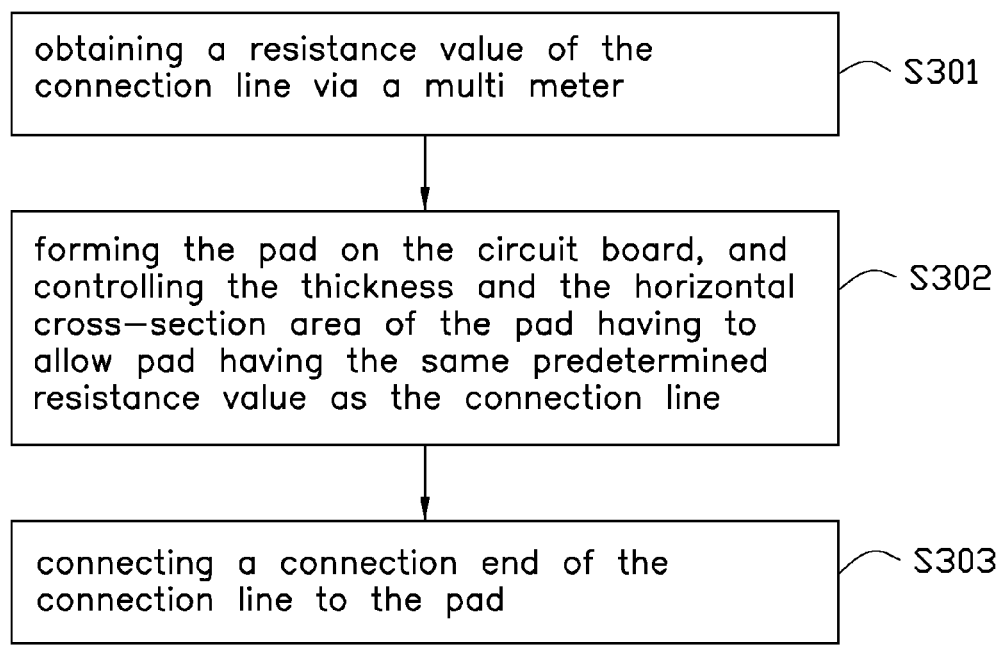
FIG. 6 is a flowchart of an impedance matching method, according to a fourth exemplary embodiment.

FIG. 6 is a flowchart of a method for impedance matching between a pad 20 and a connection line 30, according to a fourth exemplary embodiment. The method includes the following steps: S301: obtaining a resistance value of the connection line 30 via a multimeter; S302: forming the pad 20 on the circuit board 10, and controlling the thickness and the horizontal cross-sectional area of the pad 20 to form a pad 20 having the same predetermined resistance value as the connection line 30; S303: electrically connecting a connection end 31 of the connection line 30 to the pad 20.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An impedance matching method for impedance matching between a pad and a connection line, the method comprising:

providing a circuit board and the pad, the pad having a predetermine thickness and having a predetermine horizontal cross-section area such that the pad having a predetermined resistance value;

forming the pad on the circuit board;

fabricating the connection line, by controlling a length and a horizontal cross-section area of the connection line to make the connection line have the same predetermined resistance value as the pad; and connecting a connection end of the connection line to the pad.

2. The method of claim 1, wherein the predetermined resistance value of the pad follows the formula: $R=\rho L/A$, wherein R is the predetermined resistance value of the pad, $\rho$ is the resistivity of the pad; L the predetermined thickness of the pad; A is the predetermined horizontal cross-section area of the pad.

* * * * *